US007064555B2

(12) United States Patent
Jamneala et al.

(10) Patent No.: US 7,064,555 B2
(45) Date of Patent: Jun. 20, 2006

(54) NETWORK ANALYZER CALIBRATION EMPLOYING RECIPROCITY OF A DEVICE

(75) Inventors: Tiberiu Jamneala, San Francisco, CA (US); David A. Feld, Newark, CA (US); Burhan Zaini, Kedah (MY)

(73) Assignee: Agilent Technologies, Inc., Palo Alto, CA (US)

( * ) Notice: Subject to any disclaimer, the term of this patent is extended or adjusted under 35 U.S.C. 154(b) by 68 days.

(21) Appl. No.: 10/368,179

(22) Filed: Feb. 18, 2003

(65) Prior Publication Data

US 2004/0160228 A1    Aug. 19, 2004

(51) Int. Cl.
 *G01R 35/00*  (2006.01)
 *G01R 27/28*  (2006.01)
 *G06F 19/00*  (2006.01)

(52) U.S. Cl. ............... 324/601; 324/638; 702/119
(58) Field of Classification Search ............ 324/601, 324/638, 646, 642, 605; 702/85, 119, 109
See application file for complete search history.

(56) References Cited

U.S. PATENT DOCUMENTS

| 4,808,913 | A | * | 2/1989 | Grace .................... 324/638 |
| 4,982,164 | A | * | 1/1991 | Schiek et al. .............. 324/638 |
| 5,666,059 | A | * | 9/1997 | Heuermann et al. ........ 324/601 |
| 5,715,183 | A | | 2/1998 | Grace et al. |
| 5,748,506 | A | | 5/1998 | Bockelman |
| 5,784,299 | A | * | 7/1998 | Evers et al. ................. 702/85 |
| 6,041,077 | A | | 3/2000 | Clark et al. ............... 375/224 |
| 6,060,888 | A | | 5/2000 | Blackham et al. |
| 6,081,125 | A | | 6/2000 | Krekels et al. |
| 6,643,597 | B1 | * | 11/2003 | Dunsmore ................. 702/104 |
| 6,647,357 | B1 | * | 11/2003 | Conte ....................... 702/189 |
| 2006/0004532 | A1 | * | 1/2006 | Maier ......................... 702/85 |

OTHER PUBLICATIONS

Andrea Ferrero, "Two-port Network Analyzer Calibration Using an Unknown "Thru"," IEEE Microwave and Guided Wave Letters, Col. 2, No. 12, Dec. 1992, pp. 505-507.
Ferrero et al., "Comparison Between a Vector Multi-port Network Analyzer and the National S-Parameter Measurement System," Jan. 1995, IEEE Article, pp. 143-144.
Bockelman et al., "Calibration and Verification of the Pure-Mode Vector Network Analyzer," IEEE Trans Microwave Theory and Tech., vol. 46, No. 7, Jul. 1998, pp. 1009-1012.

(Continued)

Primary Examiner—Anjan Deb

(57) ABSTRACT

A vector network analyzer calibration employs measurements of an asymmetric reciprocal device to determine a value of a defining parameter of a calibration standard in a set of calibration standards. A method of determining a parameter value determines and reports the parameter value. A method of compensating a calibration determines the parameter value and employs the determined parameter value to optimize a set of error coefficients of an error model of the vector network analyzer. A vector network analyzer that includes a controller, a test set, and computer program executed by the controller, compensates a calibration using the determined parameter value and a set of optimized error coefficients. A calibration compensation system that includes a vector network analyzer, a computer, and a computer program executed by the computer, determines and reports the parameter value.

25 Claims, 6 Drawing Sheets

OTHER PUBLICATIONS

Wojciech et al., "Simultaneous Noice and Vector Network Analysis Using Radiometer Systems," IEEE Article, Jan. 1999, pp. 198-229.

Andrea Ferrero, Two-part Network Analyzer Calibration Using an Unknown "Thru" IEEE Microwave and Guided Wave Letters, col. 2, No. 12, Dec. 1992, pp. 507-507.

* cited by examiner

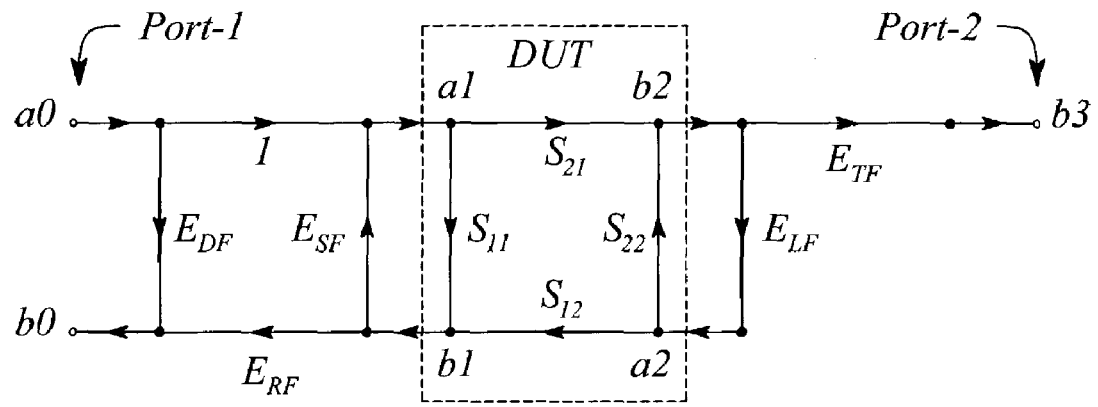
FIG. 2A  *Prior Art*
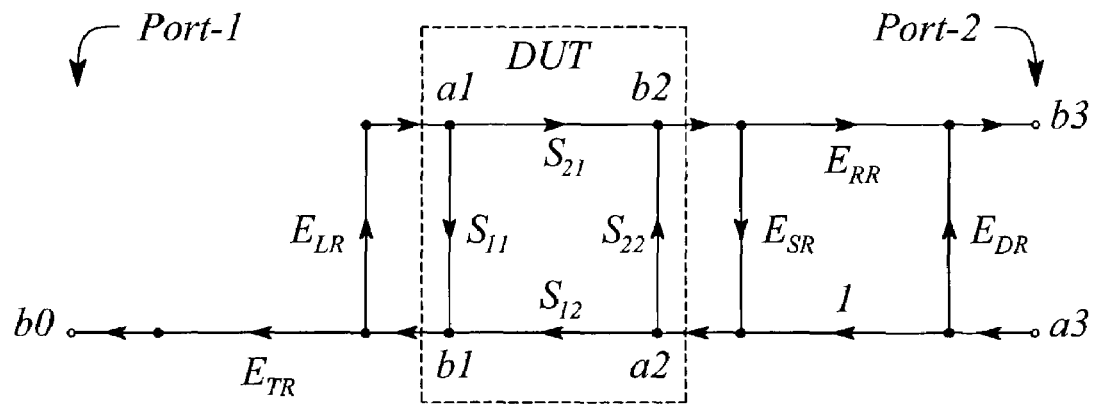
FIG. 2B  *Prior Art*

NETWORK ANALYZER CALIBRATION EMPLOYING RECIPROCITY OF A DEVICE

TECHNICAL FIELD

The invention relates to electronic test and measurement equipment. In particular, the present invention relates to calibration of electronic test and measurement equipment such as vector network analyzers.

BACKGROUND ART

A vector network analyzer (VNA) measures a performance of a radio frequency (RF) and/or microwave/millimeter wave device under test (DUT) and produces measured results in terms of network scattering parameters. Network scattering parameters, more commonly known as 'S-parameters', are transmission and reflection (T/R) coefficients for the DUT computed from measurements of voltage waves traveling toward and away from a port or ports of the DUT. In general, an S-parameter is expressed either in terms of a magnitude and phase or in an equivalent form as a complex number, the complex number having a real part and an imaginary part. A set of four such S-parameters, namely $S_{11}$, $S_{12}$, $S_{21}$, and $S_{22}$ each represented by a complex number, provide a complete characterization of linear RF performance of a given two-port DUT at a single frequency. Similarly, a series or sequence of S-parameters, each member of the sequence having been measured at one of multiple different frequencies across an operational frequency range of the DUT, characterizes a frequency performance of the DUT.

As with all test and measurement equipment, VNAs introduce errors into measured S-parameter data produced for a given DUT. The presence of these errors distorts or corrupts the measurements of actual S-parameter data for the DUT. Fortunately, the effects of at least the so-called 'systematic' errors introduced by the VNA and any associated test system (e.g., cables, connectors, fixture, etc) may be characterized and subsequently removed from measurements of the DUT. Such a characterization and subsequent removal of the systematic error effects are generally known as VNA calibration.

In simple terms, a VNA calibration involves measuring S-parameters of a set of specialized devices known as 'calibration standards' using the VNA being calibrated. A set of error coefficients for an error model of the VNA is then computed from the measured S-parameters using known values of certain defining parameters of the calibration standards. Once computed, the error coefficients may be used to apply a correction to 'raw' or 'as measured' S-parameter data produced by the VNA for the DUT. The correction so applied mathematically to the data essentially removes the effects of the systematic errors from the raw S-parameter data yielding 'error corrected' or 'calibrated' measured S-parameter data for the DUT. Thus, the calibrated or error corrected data for the DUT generally represents, or is interpreted as being, an accurate indication of an 'actual' performance for the DUT independent of the VNA.

Unfortunately, it is not always convenient or even possible, in many cases, to construct and/or characterize a set of calibration standards, the defining parameters of which are known with sufficient accuracy for calibration purposes over a frequency range of interest. An example of such a situation where constructing and/or characterizing calibration standards is difficult occurs when testing a DUT that must be mounted in a test fixture. Another related example is where the DUT is embedded in a printed circuit board (PCB). Moreover, even in cases where it is possible to manufacture precision standards, the calibration standards may be very expensive owing to a need to control and accurately characterize the performance of such standards. The high cost of precision calibration standards may effectively prohibit their use in many cost sensitive enterprises.

Accordingly, it would be advantageous to calibrate a VNA without relying on using a set of calibration standards having accurately known characteristics. Such a calibration would solve a long-standing need in the area of calibrating a VNA using calibration standards.

SUMMARY OF THE INVENTION

The present invention facilitates a calibration of a vector network analyzer (VNA) using calibration standards. In particular, the present invention employs measurements of an asymmetric reciprocal device to correct for inaccurately known defining parameters of the calibration standards used for VNA calibration. Using the measurements of the asymmetric reciprocal device, values of the defining characteristics or parameters of the calibration standards are adjusted until optimized. As a result, calibration standards having poorly known or inadequately characterized parameters may be employed to calibrate the VNA to a degree and level of accuracy normally associated with precision calibration standards. Moreover, the present invention facilitates the characterization of poorly known calibration standards enabling such standards to be essentially treated and employed as 'precision' standards.

In one aspect of the present invention, a method of determining a parameter value of a defining parameter of a calibration standard in a set of calibration standards used to calibrate a VNA is provided. In particular, the method of determining a parameter value employs measurements of S-parameters of an asymmetric reciprocal device to determine the parameter value. One or more parameter values of respective one or more defining parameters of one or more of the calibration standards in the set may be simultaneously determined.

In some embodiments of the present invention, the method of determining a parameter value comprises measuring S-parameters of the set of calibration standards using the VNA. The method further comprises measuring raw S-parameters for an asymmetric reciprocal device using the VNA. The method of determining further comprises adjusting the parameter value. Specifically, the parameter value is adjusted to minimize a difference between a corrected forward transmission S-parameter and a corrected reverse transmission S-parameter of the asymmetric reciprocal device. The corrected forward and reverse S-parameters are the raw measured forward and reverse S-parameters for the asymmetric reciprocal device corrected using an error model-based error correction. The error model-based error correction employs error coefficients computed from the measured S-parameters of the set of calibrations standards using the parameter value being adjusted. An adjusted parameter value that minimizes the S-parameter difference of the asymmetric reciprocal device is an optimized parameter value. The method of determining a parameter value may further comprise reporting the optimized parameter value. Following determining the parameter value, the calibration standards of the set may be employed in place of conventional, precision calibrations standards to perform calibrated measurements on the DUT.

In another aspect of the invention, a method of compensating a calibration of a VNA is provided. In particular, the method of compensating determines and removes effects of inaccuracies in a parameter value of a defining parameter of a calibration standard in a set of calibration standards used to calibrate the VNA.

The method of compensating a calibration comprises measuring S-parameters for the set of calibration standards, measuring raw S-parameters of an asymmetric reciprocal device using the VNA, and adjusting the parameter value of the defining parameter of the calibration standard to determine an optimized parameter value. The method of compensating a calibration further comprises storing a set of error coefficients for the error model, the error coefficients being computed from the measured S-parameters of the set of calibration standards using the optimized parameter value produced by adjusting. After storing, the error coefficients may be used to perform calibrated measurements of a DUT using the VNA. In yet another aspect of the invention, a VNA that compensates for inaccuracies in knowledge of calibration standard parameter values and a calibration compensation system are provided.

Advantageously, the present invention may be used to determine one or more parameter values of non-precision or poorly characterized calibration standards such as, but not limited to, those constructed for in situ testing of a DUT in a test fixture or printed circuit board (PCB). In addition, the present invention may be employed as a verification tool to verify known parameter values of precision or semi-precision calibration standards. Certain embodiments of the present invention have other advantages in addition to and in lieu of the advantages described hereinabove. These and other features and advantages of the invention are detailed below with reference to the following drawings.

BRIEF DESCRIPTION OF THE DRAWINGS

The various features and advantages of the present invention may be more readily understood with reference to the following detailed description taken in conjunction with the accompanying drawings, where like reference numerals designate like structural elements, and in which:

FIG. 2A illustrates a flow graph representation of a conventional forward portion of a twelve-term error model for a two-port VNA.

FIG. 2B illustrates a flow graph representation of a conventional reverse portion of the twelve-term error model for a two-port VNA.

MODES FOR CARRYING OUT THE INVENTION

Figure 1:
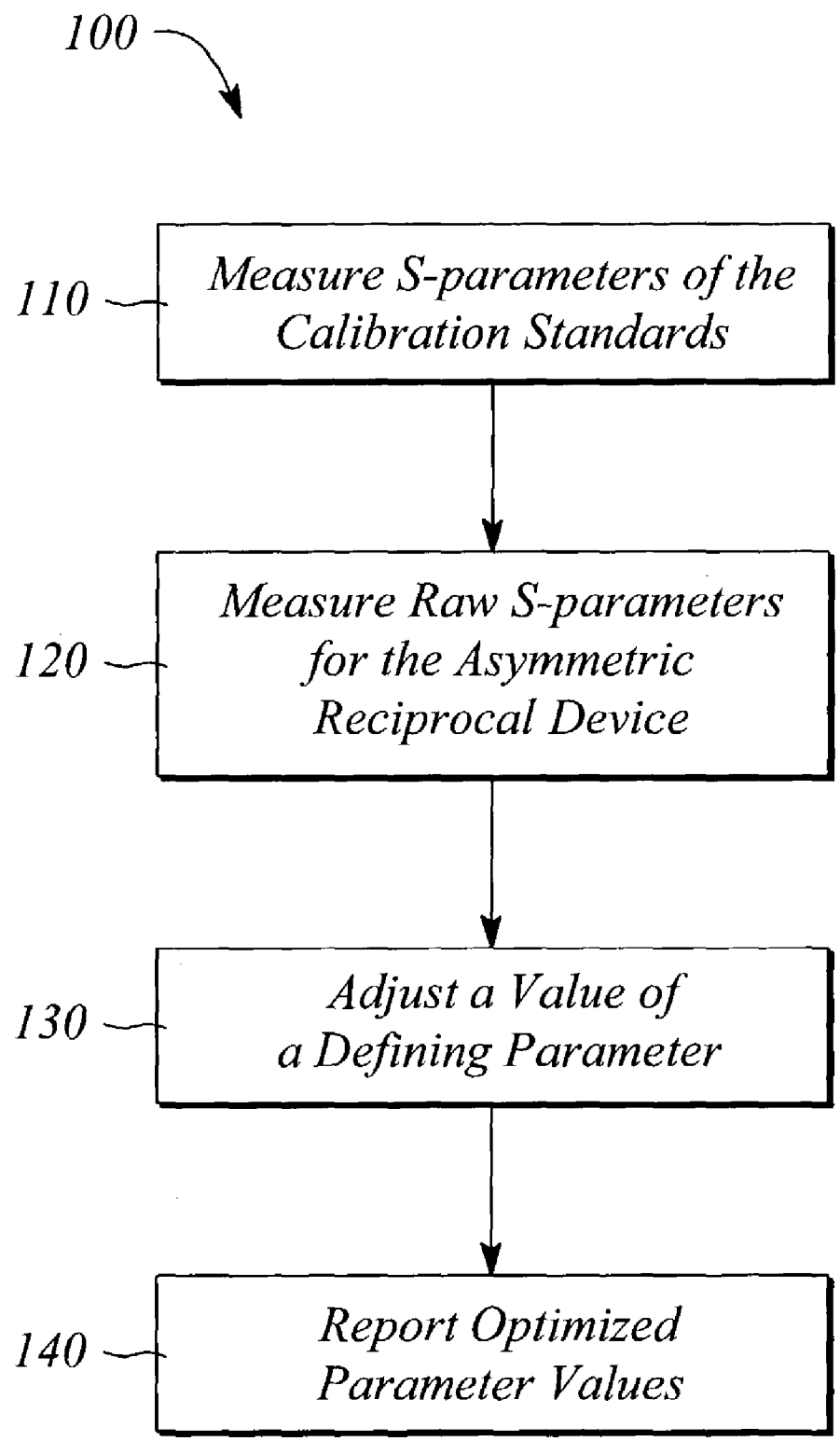
FIG. 1 illustrates a flow chart of a method of determining a parameter value of a defining parameter of a set of calibration standards used to calibrate a vector network analyzer (VNA) according to an embodiment of the present invention.

FIG. 1 illustrates a flow chart of a method of determining a parameter value of a defining parameter of a set of calibration standards used to calibrate a vector network analyzer (VNA) according to an embodiment of the present invention. The method 100 of determining determines the parameter value by adjusting the parameter value to minimize a difference between a corrected measured forward transmission S-parameter and a corrected measured reverse transmission S-parameter of an asymmetric reciprocal device. In particular, the method 100 of determining employs a difference between the corrected measurements of a forward transmission S-parameter and a reverse transmission S-parameter of the asymmetric reciprocal device at frequencies of interest as an optimization metric to produce an optimized parameter value.

Once determined, the optimized parameter value may be employed to make calibrated measurements of a device under test (DUT). The method 100 of determining a parameter value may be used to simultaneously determine parameter values of more than one defining parameter of the set of calibration standards. By determining the parameter value or values, the method 100 facilitates using calibration standards having unknown or poorly known defining parameters when performing a VNA calibration.

According to the present invention, 'a' and 'an' mean 'one or more', such that one or more parameter value(s) of a respective one or more 'unknown' or 'poorly known' defining parameter(s) of one or more calibration standard(s) in a set of calibration standards are determined. As used herein, a 'defining parameter' is a parameter of a calibration standard that is employed, either directly or indirectly, in determining a set of error coefficients associated with an error model of the VNA from measurements of the calibration standard. Furthermore as used herein, an 'unknown' or 'poorly known' parameter is a parameter having a value that is either completely unknown or is not known with sufficient accuracy over a frequency range of interest to support a desired error correction of the calibration using conventional calibration methods. An 'asymmetric' device is any device for which a reflection S-parameter of a first port (e.g., port-1) is different in one or both of a magnitude and a phase from a reflection S-parameter of a second port (e.g., port-2) in at least a portion of a frequency range or band of interest. For example, a particular device having a reflection S-parameter $S_{11}$ at port-1 that is not equal to a reflection S-parameter $S_{22}$ at port-2 in at least some portion of the frequency range of interest is an asymmetric device.

A calibration standard having an unknown or poorly known defining parameter is often referred to as an 'unknown' or 'non-precision' calibration standard. For example, an unknown calibration standard may be one developed for in situ testing of a DUT that is mounted in a printed circuit board (PCB) or a text fixture. Preferably, and not necessarily, the unknown calibration standard should approximate one type of a known or precision standard used in a conventional standards-based calibration. An operational range of the DUT and/or of the standard typically defines the frequency range of interest. The method 100 of determining a parameter value according to the present invention may involve a broader frequency range than the frequency range of interest for the DUT to provide for a desired or an adequate calibration of the VNA. One of ordinary skill in the art can readily determine a frequency range for the method 100 of determining a parameter value given a frequency range of interest of the DUT without undue experimentation.

Conversely, a 'known' or a 'precision' calibration standard is a calibration standard having known defining parameters. In particular, a precision standard is a standard for which a parameter value of each defining parameter of the calibration standard is know with sufficient accuracy and precision to support a calibration of the VNA. Often, precision calibration standards have parameter values provided by and guaranteed by a manufacturer of the calibration standard. Alternatively, defining parameter values for a particular precision standard may be measured by one of several known methods after the calibration standard is constructed and prior to its use as a precision standard for calibration purposes. One skilled in the art is familiar with precision calibration standards and the application of precision standards to VNA calibration.

The asymmetric reciprocal device may be any asymmetric device having an 'actual' forward transmission S-parameter (e.g., $S_{21}$) that essentially equals an actual reverse transmission S-parameter (e.g., $S_{12}$) in a frequency range of interest. As used herein, the term 'actual' refers to a true characteristic of a device and is meant to distinguish the characteristic from a 'measured' characteristic that includes errors, both systematic and random, associated with a system (e.g., a VNA) used to perform the measurement.

A measured characteristic may be either 'raw' measured characteristics or 'corrected' measured characteristics. As used herein, the term 'raw' indicates that the measured characteristic is uncorrected and generally includes systematic errors associated with the measurement system. Also as used herein, the term 'corrected' generally refers to a measured characteristic to which a correction has been applied. In some cases, a corrected measurement may be referred to as a 'calibrated' measurement to indicate that the measurement was made using a calibrated system. Typically, an error model-based correction is used in VNA measurements to generate corrected or calibrated measurements from raw measurements of S-parameters of a device.

In general, when using precision calibration standards having accurately known parameter values for the defining parameters, the correction applied to generate a corrected or calibrated measurement reduces or essentially eliminates the effects of the systematic errors of the measurement system. However, when a calibration standard having a poorly known or unknown defining parameter value is employed, the corrected measurement necessarily includes an error component associated with the knowledge or more correctly, the lack of knowledge of the parameter value. In other words, an error in a parameter value of a defining parameter of the calibration standard introduces an error in the correction applied to produce the corrected measurement.

Thus, herein the term 'calibrated' measurement will be used to refer to a corrected measurement when using precision calibration standards having well-known or well-characterized parameter values. The term 'corrected' measurement will be reserved for measurements that have been corrected using a set of calibration standards where a calibration standard of the set may have a poorly known or inadequately characterized parameter value. Of course, once a parameter value used to produce a corrected measurement becomes known with sufficient accuracy for calibration purposes, the corrected measurement essentially becomes a calibrated measurement. The terms 'corrected' and 'error corrected' are used interchangeably hereinbelow. The term 'essentially equals' mean the parameters have the same values or values that are similar.

As is well known in the art, a linear, passive, time reversal symmetric, two-port device exhibits reciprocal behavior. Specifically, linear, passive, time reversal symmetric, two-port devices will have an actual forward transmission S-parameter $S_{21}$ that essentially equals an actual reverse transmission S-parameter $S_{12}$. Examples of reciprocal devices include, but are not limited to, low pass filters, high pass filters, bandpass filters, attenuators, and finite length transmission lines. Moreover, one skilled in the art recognizes that the term 'linear', as used herein, includes 'approximately linear', as is well known in the art of linear devices. Many reciprocal devices are also asymmetric reciprocal devices.

The asymmetric reciprocal device is preferably a two-port device having unequal input and output reflection S-parameters as defined hereinabove. In particular, the asymmetric reciprocal two-port device preferably exhibits a difference between an input reflection S-parameter $S_{11}$ at a first port referred to herein as 'port-1' and an input reflection S-parameter $S_{22}$ at a second port referred to herein as 'port-2'. The distinction between port-1 and port-2 is made for discussion purposes only and in no way limits the present invention. Likewise, reference herein to using a two-port asymmetric reciprocal device or a two-port VNA is made for discussion purposes and not by way of limitation.

More preferably, a bigger difference rather than a smaller difference between the reflection parameters $S_{11}$ and $S_{22}$ of the asymmetric reciprocal device is desirable. In general, the bigger the difference, the better or higher quality are the results according to the present invention. Moreover, it is preferable that the difference in the reflection parameters $S_{11}$ and $S_{22}$ be present at least to some extent over an appreciable portion of a frequency range of interest of the DUT. How different the $S_{11}$ and $S_{22}$ reflection parameters are and over what portion of the frequency range the difference exists ultimately affect a speed and an accuracy with which a determination 100 of a parameter value is arrived at, according the present invention. However, all reciprocal devices exhibiting at least some difference in the reflection parameters $S_{11}$ and $S_{22}$ over at least some portion of a frequency range are within the scope of the present invention.

For example, a low-loss, narrow bandpass filter having a passband near a lower frequency range of a frequency range of interest is known to exhibit a relatively large difference between reflection parameters $S_{11}$ and $S_{22}$ over much of a typical frequency range of interest. In particular, the reflection parameters $S_{11}$ and $S_{22}$ of such a bandpass filter are likely to be very different from one another from an upper passband edge of the filter up to a frequency point at which higher order modes tend to compromise a rejection characteristic of such a filter. Thus, this sort of filter is often an ideal choice for use as the asymmetric reciprocal device according to the present invention. On the other hand, an attenuator having a high attenuation level (e.g., 40 dB) is not likely to exhibit much difference between the reflection parameter $S_{11}$ at port-1 and the reflection parameter $S_{22}$ at port-2. Thus, such an attenuator would be less desirable as the asymmetric reciprocal device according to the present invention. From the above-referenced example and employing widely held knowledge of radio frequency (RF) and microwave devices, one skilled in the art can readily identify and select a suitable asymmetric reciprocal device according to the present invention without undue experimentation.

Referring again to FIG. 1, the method 100 of determining a parameter value comprises measuring 110 S-parameters for the standards in a set of calibration standards using the VNA. The S-parameters that are measured 110 are those normally associated with the calibration standards. For example, an input port reflection S-parameter $S_{11}$ is measured 110 for a calibration standard that represents a short circuit.

Furthermore, the S-parameters are measured 110 over a range of frequencies that preferably spans a frequency range for which a calibration of the VNA is to be performed. Additionally, a number of frequency points within the frequency range at which the S-parameters of the calibration standards are measured is preferably greater than or equal to a number of parameter values that are determined 100. For example, if there are three parameter values of respective three defining parameters being determined 100, preferably there are at least three frequency points within the frequency range at which the S-parameters of the standards of the set of calibration standards are measured 110. As is consistent with conventional calibration standards measurement during a VNA calibration, an order in which the calibration standards of the set are measured 110 is not important.

In general, a type of calibration being performed with the VNA determines the set of calibration standards and the S-parameter measurements normally associated with each calibration standard of the set. For example, a well-known type of calibration is a so-called 'SOLT' calibration. The set of calibration standards used in an SOLT calibration include a short circuit ('short'), an open circuit ('open'), a load, and a through ('thru'). A reflection S-parameter measurement at each port of an exemplary two-port VNA (e.g., $S_{11}$ at port-1 and $S_{22}$ at port-2, respectively) is normally associated with the short standard. As such, implicit in measuring 110 are a determination of what type of calibration is to be performed and a choice of a set of calibration standards to be used. In turn, the type of calibration determines the normally associated measurements 110.

The choice of calibration standards is based on conventional guidelines for choosing calibration standards. Conventional guidelines include choosing calibration standards that have S-parameters that are widely spaced apart from each other in the complex S-parameter plane. Often, the determination of calibration type (e.g. SOLT) is dictated by the particular network analyzer being used. A discussion of calibration standards, SOLT calibration methods, and conventional in-fixture calibration are provided in Agilent application notes AN1287-3, Applying Error Correction to Network Analyzer Measurements, PN 8510-5A, Specifying Calibration Standards for the Agilent 8510 Network Analyzer, and AN 1287-9, In-Fixture Measurement Using Vector Network Analyzers, all three of which are incorporated herein by reference. The present invention applies to error correction methodologies or calibration types that employ error models having twelve or more terms. For the purposes of discussion and without loss of generality, an SOLT calibration type that employs a twelve-term error model will be assumed hereinbelow. One skilled in the art may readily extend the discussion herein with respect to the SOLT calibration type to other calibration types related to SOLT without undue experimentation.

As described hereinabove, unlike the conventional calibration types, such as those described in the above-referenced application notes, a calibration standard in the set of calibration standards, according to the present invention, need not be a precision device having well-characterized parameters. On the contrary, the method 100 of determining a parameter value according to the present invention explicitly determines one or more parameter values of respective defining parameter(s) of the calibration standards in the set. However, at least one calibration standard of the set of standards should be a precision standard (i.e., one having known defining parameters). Thus for example, calibration standards that approximate a short, an open, a load, and a through may be employed as the short, open, load and thru standards, respectively, of an SOLT according to the present invention. Preferably, the precision calibration standard employed is the thru since the thru standard is more readily characterized than the short, open, or load standards using convention characterization methodologies.

An example of a situation where it may be advantageous to use approximate or non-precision standards is 'in fixture' testing of a DUT. In general, the test fixture serves two principal roles: adapting a standard interface of the VNA to that of the DUT, and physically/electrically mimicking the mounting environment of the DUT. The test fixture can be as simple or as complex as is required by the test being performed on the DUT. For example, a typical standard interface for the VNA is a set of coaxial cables having one of several standardized connector types on terminating ends. The test fixture can serve as a transition or adaptor between the standardized connectors of the coaxial cables and a non-standard DUT interface (e.g. solder pin or tab). In other situations, the test fixture may provide mounting and power connections as well as serve as an interface adaptor for a DUT lacking standardized connectors. Alternatively, the test fixture may be simply a connector on the end of a cable or a connector adaptor that adapts one connector type to another in a case where the DUT has standardized connectors. The test fixture may even be a 'null' fixture having zero loss, zero electrical length and no parasitics. A DUT that is mounted in a PCB to facilitate measurement using a VNA is equivalent to 'in-fixture' testing. Preferably, a high isolation, low common ground inductance fixture is used. An example of such a fixture is described in a co-pending patent application of David A. Feld et al., Ser. No. 10/331,714, filed Dec. 27, 2002, entitled "System and Method for Providing High RF Signal Isolation and Low Common Ground Inductance in an RF Circuit Testing Environment", incorporated herein by reference. One skilled in the art is familiar with test fixtures and their use in conjunction with testing DUTs.

Once again referring to FIG. 1, the method 100 of determining a parameter value further comprises measuring 120 S-parameters of the asymmetric reciprocal device. In particular for a two-port asymmetric reciprocal device, a raw input reflection S-parameter $S_{11}$, a raw output reflection S-parameter $S_{22}$, a raw forward transmission S-parameter $S_{21}$, and a raw reverse transmission S-parameter $S_{12}$ are measured 120 using the VNA. In the case of in-fixture testing, the reciprocal device preferably fits or is mountable in the test fixture.

The raw S-parameters $S_{11}$, $S_{22}$, $S_{21}$, and $S_{12}$ are measured 120 over a range of frequencies that span the frequency range for which a calibration of the VNA is to be performed. As with the measurement 110 of the calibration standards, preferably a number of frequency points over which the S-parameters of the asymmetric reciprocal device is measured 120 is greater than or equal to the number of parameters that are determined 100. More preferably, the same frequency points are used for measuring 110 the calibration standards and for measuring 120 the asymmetric reciprocal device. An order in which the raw S-parameters $S_{11}$, $S_{22}$, $S_{21}$, $S_{12}$ are measured 120 is unimportant. Moreover, an order in which the calibration standards are measured 110 and the asymmetric reciprocal device is measured 120 is also unimportant with respect to the present invention. Thus, measuring 120 the asymmetric reciprocal device may be performed either prior to or subsequent to measuring 110 the calibration standards.

The method 100 of determining a parameter value further comprises adjusting 130 the parameter value of the defining parameter of the calibration standard in the set. Specifically, adjusting 130 comprises optimizing the parameter value in such a way that a difference between a corrected forward transmission S-parameter $S_{21}$, and a corrected reverse transmission S-parameter $S_{12}$ for the asymmetric reciprocal device is minimized. The corrected forward and reverse S-parameters are the raw measured 120 forward and reverse S-parameters, $S_{21}$ and $S_{12}$, for the asymmetric reciprocal device that have been corrected using an error model of the VNA. The error model, in turn, employs the parameter value being adjusted 130 along with the measured 110 S-parameters for the calibration standards to determine error coefficients of the error model. The determined error coefficients are used to produce the corrected measured S-parameters from the raw measured S-parameters of the asymmetric reciprocal device. Thus, adjusting 130 the parameter value ultimately adjusts the error coefficients and has an effect on the corrected measured S-parameters of the asymmetric reciprocal device that allows for an assessment of whether or not the forward and reverse transmission S-parameter difference is minimized.

For example, the VNA may employ a so-called 'twelve-term' error model to correct for systematic errors associated with measurements performed by the VNA. All of the major systematic errors associated with using a VNA to measure S-parameters can be accounted for by six types of errors: directivity and crosstalk related to signal leakage, source and load impedance mismatches related to reflections, and frequency response errors related to reflection and transmission tracking within test receivers of the VNA. Thus for a VNA, measuring S-parameters of a general two-port DUT, there are six forward-error terms and six reverse-error terms for a total of twelve error coefficients or terms (including two terms that combine the various transmission crosstalk terms into a forward crosstalk or a reverse crosstalk term). Such a full measurement calibration for a general two-port DUT is often referred to as a 'twelve-term' error correction or calibration using a twelve-term error model. An extension of the twelve-term error model for a full measurement calibration of a multiport network analyzer (i.e., a network analyzer having more than two ports) often is referred to as a twelve-term error model also, even though such an error model necessarily has more than twelve terms.

FIG. 2A illustrates a flow graph representation of a conventional forward portion of a twelve-term error model for a two-port DUT. FIG. 2B illustrates a flow graph representation of a conventional reverse portion of the twelve-term error model. The error-terms or error coefficients of the twelve-term error model are represented as vertices in the flow graph.

The twelve-term error model for the VNA, in turn, employs definitions of the calibration standards in the set associated with calibrating the VNA. The definitions usually comprise values of certain defining parameters of the calibration standards being employed. The parameter values are used in models of the calibration standards in conjunction with measured S-parameters of the calibration standards to extract the error coefficients for the twelve-term error model. Once the error coefficients are known, the error model may be employed to apply a correction to raw measured S-parameters of a DUT to produce calibrated measured S-parameters for the DUT.

Figure 3:
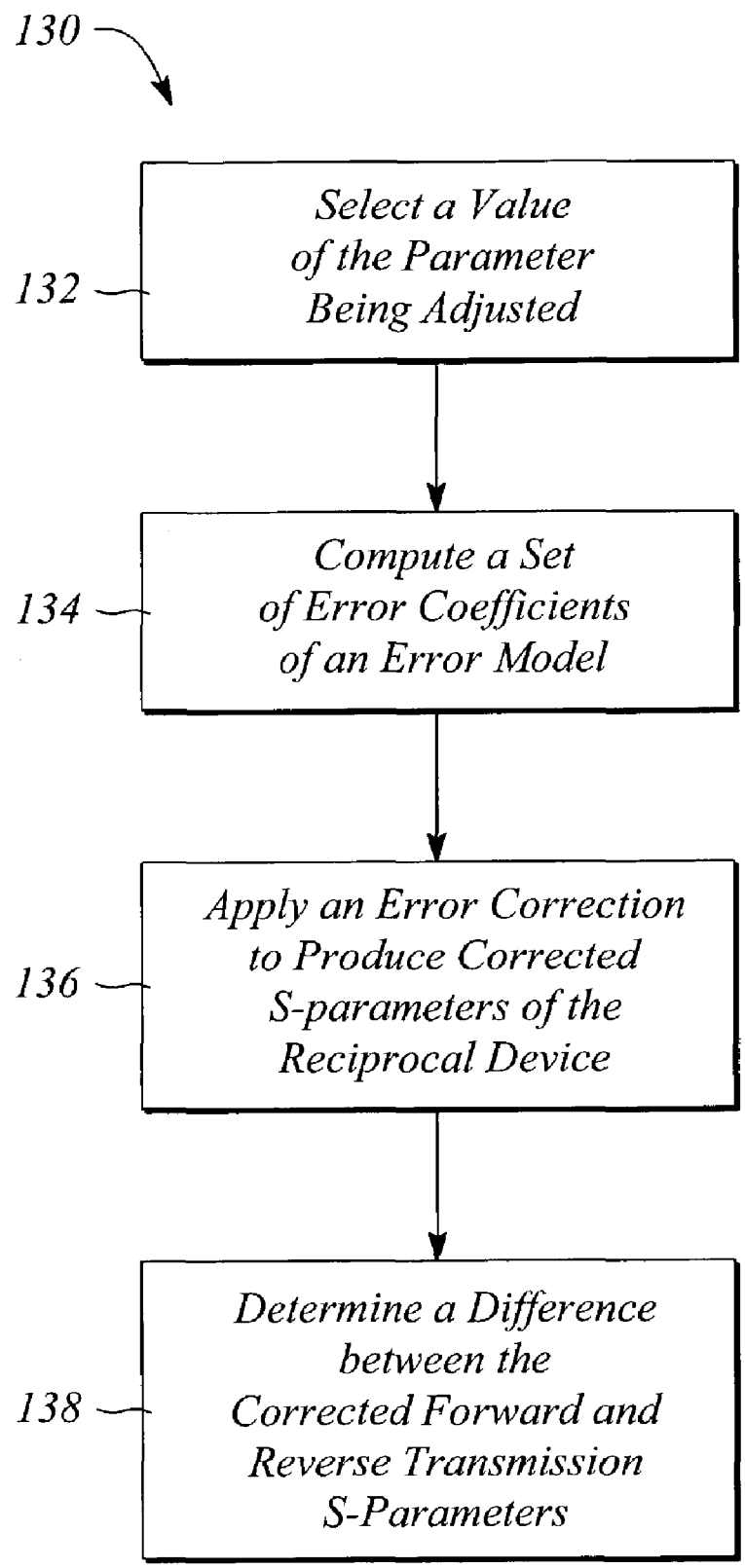
FIG. 3 illustrates a flow chart of an embodiment of adjusting a parameter value according to the present invention.

FIG. 3 illustrates a flow chart of an embodiment of adjusting 130 the parameter value according to the present invention. Adjusting 130 comprises selecting 132 a specific value to establish a current value of the parameter value. Adjusting further comprises computing 134 a set of error coefficients. Computing 134 utilizes the measured 110 S-parameters of the set of calibration standards along with the selected 132 parameter value. Therefore, the computed 134 error coefficients are a function of the selected 132 parameter value. Adjusting further comprises applying 136 an error correction to the measured 120 raw forward and raw reverse transmission S-parameters, $S_{21}$ and $S_{12}$, of the asymmetric reciprocal device using the computed 134 error coefficients and the measured 120 raw S-parameters $S_{11}$, and $S_{22}$. Applying 136 an error correction produces corrected forward and corrected reverse transmission S-parameters, $S_{21}$ and $S_{12}$, for the asymmetric reciprocal device.

Adjusting 130 further comprises determining 138 a difference between the corrected forward transmission S-parameter $S_{21}$ and the corrected reverse transmission S-parameter $S_{12}$. The process of adjusting 130, which includes selecting 132 a specific value, computing 134 a set of error coefficients, applying 136 an error correction, and determining 138 a difference, is repeated until the difference between the corrected measured forward and reverse transmission S-parameters of the asymmetric reciprocal device is minimized.

As such, adjusting 130 the parameter value according to the present invention may be viewed equivalently as an iterative optimization of the error coefficients of the error model, the iteration being terminated when the results of the error correction is judged to be satisfactory. A metric such as the difference between the corrected measured forward and reverse transmission S-parameters, $S_{21}$ and $S_{12}$, of the asymmetric reciprocal device is used to assess the progress of the optimization. When progress is no longer expected or required, the optimization iterations are discontinued and a current set of error coefficients or equivalently, a current parameter value or a current set of parameter values from which the error coefficients are determined, is taken to be an optimized set. The metric (e.g., difference) is employed to decide whether or not to continue iterating. As discussed hereinabove, the actual forward and reverse transmission S-parameters, $S_{21}$ and $S_{12}$, are theoretically equal. Therefore, when the difference between the corrected forward and reverse transmission S-parameters, $S_{21}$ and $S_{12}$, of the asymmetric reciprocal device is smaller than a predetermined error value $\delta$, the adjusted 130 parameter value or set of values may be assumed to be optimized and the iterating of the adjustment 130 may be terminated.

Essentially, any number of iterative optimization methodologies or approaches may be used in adjusting 130 the parameter value. In particular, adjusting 130 the parameter value may employ an optimization such as, but not limited to, an exhaustive search, a random search, a conjugate gradient optimization, a Powel's method optimization, or a genetic algorithm optimization. In most cases, well-known iterative optimization methodologies typically differ primarily in a way in which a next value or set of values used by the metric is chosen or selected 132 at a beginning of each iterative cycle. For example, in a random search (aka Monte Carlo) optimization, a selection 132 of a next value or set of values is random. On the other hand, in a gradient-type optimization, a next value or set of values is selected 132 in such a way that a search trajectory is caused to ultimately follow a gradient of an optimization surface defined by the metric. Specifically, it is not the intent of the present invention to be limited in any way by a choice of a specific optimization methodology for adjusting 130 the parameter value.

As described above, a metric involving the corrected measured transmission S-parameters $S_{21}$ and $S_{12}$ of the asymmetric reciprocal device is used in conjunction with the optimization inherent in adjusting 130. Virtually any arbitrary metric that assesses and quantifies a difference between the corrected transmission S-parameters, $S_{21}$ and $S_{12}$, of the asymmetric reciprocal device may be employed. In particular, a difference between magnitudes and/or phases of the corrected measured transmission S-parameters $S_{21}$ and $S_{12}$ may be used as a metric. For example, a useful metric M that employs a sum of a square of a magnitude of a difference between individual corrected measured forward and reverse transmission S-parameters, $S_{21}$ and $S_{12}$, is given in equation (1).

$$M = \sum_f |S_{21} - S_{12}|^2 \quad (1)$$

As given in equation (1), the summation is taken over a set of frequency points f and the metric M is identically zero (M=0) if and only if the corrected measured transmission S-parameter $S_{21}$ equals the corrected measured transmission S-parameter $S_{12}$ at all frequency points f. One skilled in the art may readily determine other similar metrics, all of which are within the scope of the present invention. For example, a root-mean-square metric and/or a sum of a difference in phase may be employed. In other examples, a combination of more than one metric may be used as the arbitrary metric.

Referring back to FIG. 1, the method 100 of determining may further comprise reporting 140 an optimized parameter value that results from the adjusting 130. The optimized parameter value is a last selected 132 or current parameter value when the iteration of adjusting 130 is terminated. The reported 140 optimized parameter value essentially represents an approximation of a true or a precision value of the parameter. Thus, following determining 100 the parameter value, the set of calibration standards may be employed in place of conventional, precision calibration standards to perform calibrated measurements on a DUT.

To better appreciate the method 100 of determining a parameter value, consider an example of using the method 100 in conjunction with an SOLT calibration of the VNA using a set of calibration standards, in which at least one calibration standard of the set is poorly known. In particular for the example, assume that a precision thru standard is available and that the set of remaining calibration standards consisting of an open, a short, and a load, is similarly available. The defining parameter values for the thru are all known while some of the defining parameter values of the open, short, and load calibration standards are either unknown or poorly known. Moreover, assume for the purposes of discussion that the open is modeled as an unknown delay followed by a known shunt capacitance, that the short is modeled as an unknown delay followed by an ideal short circuit (i.e., zero inductance), and that the load is modeled as a fixed delay having an unknown load impedance $Z_{load}$ followed by an ideal termination having a 50 Ohm impedance.

Figure 4A:
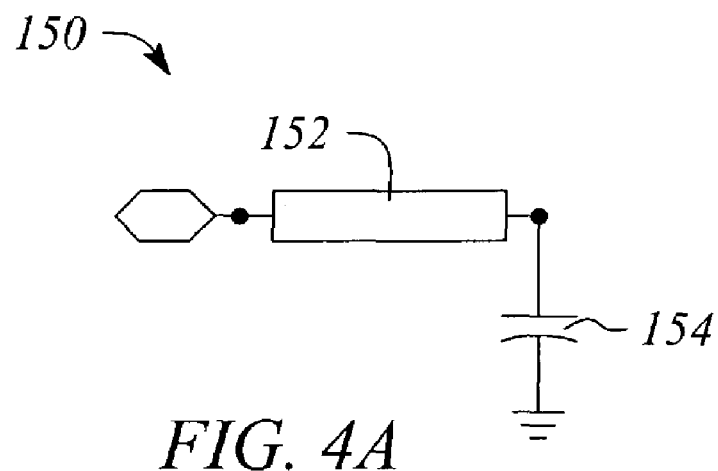
FIG. 4A illustrates a model of an exemplary open calibration standard having an unknown delay in accordance with an embodiment of the present invention.
Figure 4B:
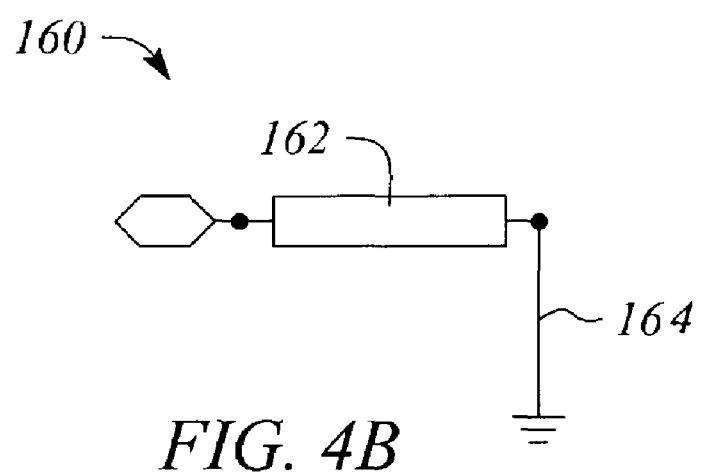
FIG. 4B illustrates a model of an exemplary short calibration standard having an unknown delay in accordance with an embodiment of the present invention.
Figure 4C:
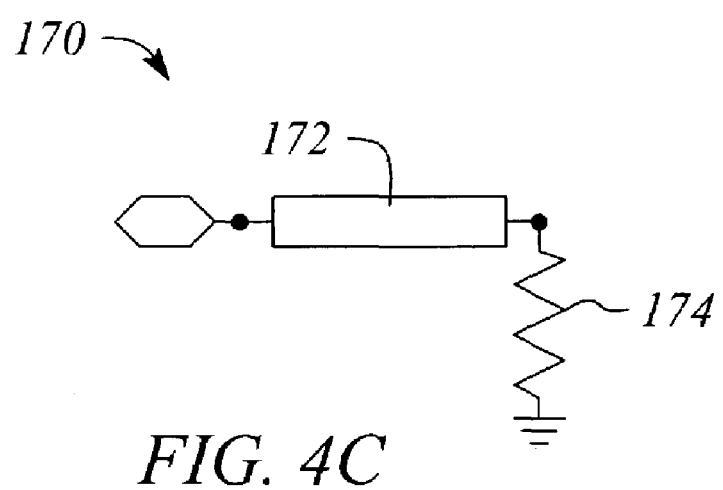
FIG. 4C illustrates a model of an exemplary load calibration standard having a fixed delay and an unknown load impedance in accordance with an embodiment of the present invention.

FIG. 4A illustrates a model of the exemplary open calibration standard 150 having an unknown delay $\Delta_{open}$. As illustrated in FIG. 4A, the exemplary open comprises a delay element 152 connected to a shunt capacitor 154. FIG. 4B illustrates a model of the exemplary short calibration standard 160 having an unknown delay $\Delta_{short}$. As illustrated in FIG. 4B, the exemplary short comprises a delay element 162 connected to a short circuit 164. FIG. 4C illustrates a model of the exemplary load calibration standard 170 having a fixed delay (i.e., known delay) with an unknown load impedance $Z_{load}$. As illustrated in FIG. 4C, the exemplary load comprises a delay element 172 having a known delay length but unknown impedance $Z_{load}$ connected to a 50 ohm termination 174.

Thus for the example, the unknown parameter values are the unknown open delay $\Delta_{open}$, the unknown short delay $\Delta_{short}$, and the unknown load impedance $Z_{load}$. All other parameters of the calibration standards in the set are known with sufficient precision for the example. In particular, an impedance and a delay of the thru standard (not illustrated) as well as a capacitance $C_0$ of the capacitor 154 of the open in the open standard 150 and the impedance of the termination 174 of the load in the load standard 170 are known with sufficient accuracy to support a calibration of the VNA. For example, the known parameters may be established through independent measurements or some other technique prior to performing the method 100. Moreover to simplify the example, an inductance of the short in the short standard 160 typically associated with the short circuit 164 is assumed to be zero.

It should be emphasized that minimizing a number of unknowns and applying simplifying assumption to the models associated with the standards, as has been done for the example, may advantageously improve a convergence and/or accuracy of the method 100 of determining a parameter value. However, minimizing the number of unknowns and using simplified models is not required according to the present invention.

Continuing with the example, raw S-parameters are measured 110 for the exemplary short, open, load and thru standards according to conventional SOLT calibration guidelines and using the VNA. Similarly, raw S-parameters, $S_{11}$, $S_{22}$, $S_{21}$ and $S_{12}$, are measured 120 for a selected asymmetric reciprocal device. In the example, a band pass filter having a narrow passband near a lower end of a frequency range of interest is chosen and used as the asymmetric reciprocal device.

Adjusting 130 the parameter values of the unknown parameters in the models of each of the calibration standards 150, 160, 170 then proceeds by selecting 132 an initial value for each of the unknown parameter values $\Delta_{open}$, $\Delta_{short}$, and $Z_{load}$. Selection 132 of initial values may be random or may employ an educated guess regarding possible parameter values. For instance, one skilled in the art may be able to determine a relatively close approximate value for the open delay $\Delta_{open}$ from a physical size/length of the open standard 150 being employed. Often, employing an educated guess or otherwise limiting a range of possible values of the unknown parameters during adjusting 130 will result in an improved convergence of the optimization being performed during adjusting 130 the parameter values. One skilled in the art is familiar with limiting optimization parameter values to improve convergence and may readily determine the initial values without undue experimentation. An educated guess is used to select the initial values for the present example.

Once selected 132, the models of the calibration standards 150, 160, 170 are used to compute 134 a set of error coefficients for the SOLT calibration. The set of error coefficients comprises six forward terms and six reverse terms consistent with a conventional twelve-term error model of the VNA, as illustrated in FIGS. 3A and 3B. An SOLT error correction, using the computed 134 set of error coefficients, is applied 136 to the measured 120 raw forward and reverse transmission S-parameters, $S_{21}$ and $S_{12}$ of the asymmetric reciprocal device. The applied 136 error correction produces corrected measured S-parameters from the raw measured S-parameters for the asymmetric reciprocal device. A difference between the corrected forward transmission S-parameter $S_{21}$ and the corrected reverse transmission S-parameter $S_{12}$ is determined 138. In particular, a metric that quantifies the difference is computed to determine 138 the difference. Once computed, the metric is compared to a goal. If the goal is achieved, adjusting 130 is terminated, and iteration is not necessary. Otherwise, a new set of parameter values is selected 132 and adjusting 130 continues in an iterative manner.

For the example, the metric is given by equation (1) hereinabove and the goal is for the computed metric M to be less than a predetermined error value $\delta$. Therefore, if the magnitude of the metric M given by equation (1) is less than the predetermined error value $\delta$ using a current set of selected 132 parameter values, the goal is deemed to have been achieved and adjusting 130 the parameter values is terminated. If the goal has not been achieved, a new set values for the unknown parameters $\Delta_{open}$, $\Delta_{short}$, and $Z_{load}$ are selected 132 and adjusting 130 continues through another iteration with computing 134, applying 136, and determining 138.

As discussed hereinabove, how the new set of values is selected 132 depends explicitly on a type of optimization being employed. For the example, a random search optimization is being performed during adjusting 130 the parameter values. As such, new values for the set of unknown parameters are selected 132 in a random manner.

After the goal has been achieved, a current set of selected 132 parameter values for the unknown parameter values represents an optimized set of parameter values for the calibration standards in the example. The optimized parameter values are optionally reported 140 and the example of the method 100 of determining is concluded. The calibration standards of the example may now be used in a conventional manner to calibrate the VNA. In particular, the calibration standards may act in a calibration of the VNA as are conventional precision standards, since the unknown parameter values are now known as a result of employing the method 100 of determining a parameter value in accordance with the present invention.

Figure 5:
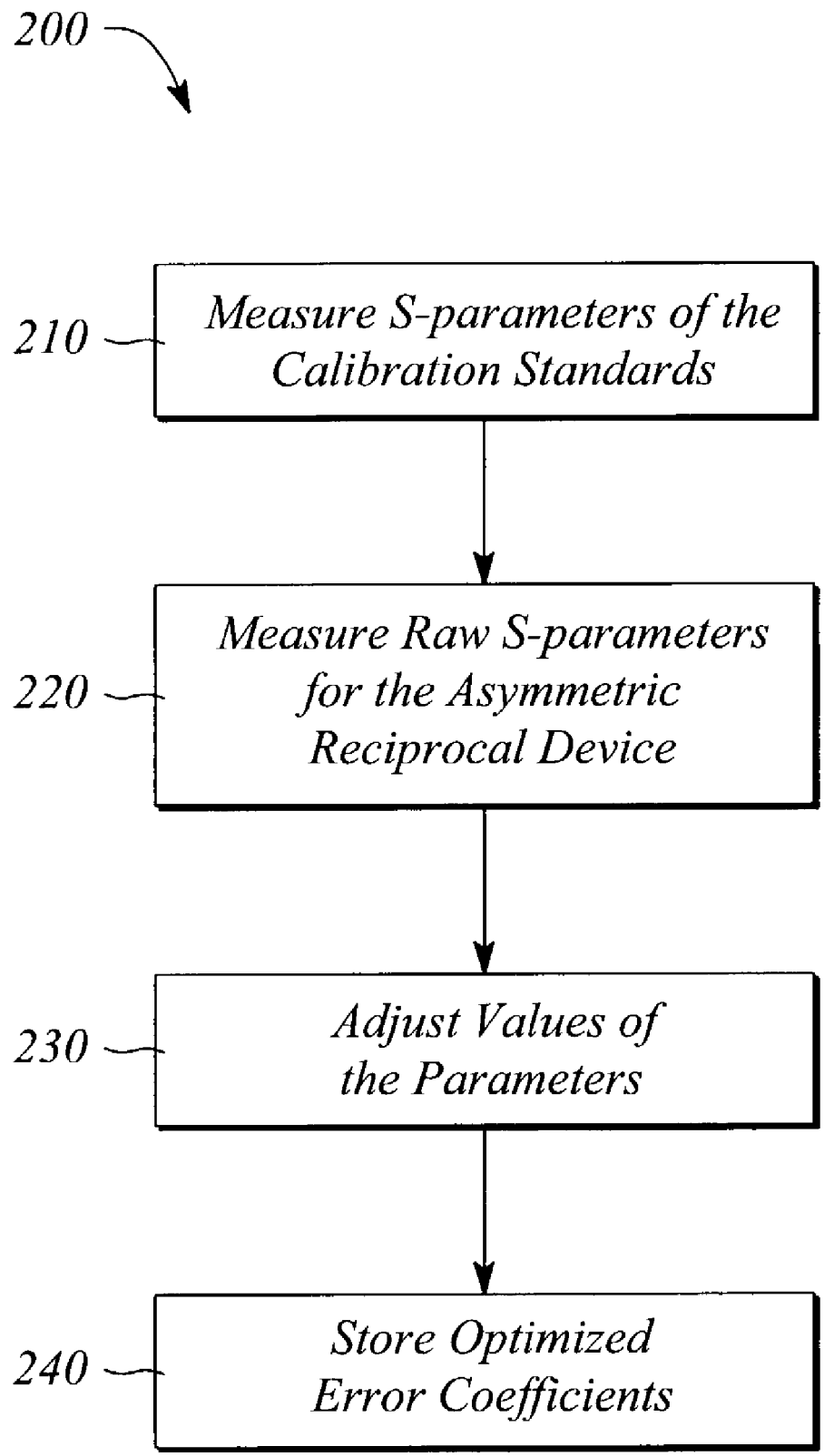
FIG. 5 illustrates a flow chart of a method of compensating a calibration of a VNA using measurements of an asymmetric reciprocal device according to an embodiment of the present invention.

FIG. 5 illustrates a flow chart of a method 200 of compensating a calibration of a VNA using measurements of an asymmetric reciprocal device according to an embodiment of the present invention. In particular, a set of error coefficients of an error model for the VNA are optimized by the method 200 to compensate for a parameter value of a defining parameter of a calibration standard in a set of calibration standards used in the calibration that may be 'poorly known' or 'inadequately characterized' or simply desired to be verified. The optimized error coefficients are ones that minimize a metric involving a difference between measured corrected forward and reverse transmission S-parameters, $S_{21}$ and $S_{12}$, of an asymmetric reciprocal device wherein the correction employs the error coefficients being optimized.

The method 200 of compensating a calibration comprises measuring 210 S-parameters for a set of calibration standards using the VNA. Preferably, S-parameters for each calibration standard in the set are measured 210. Measuring 210 S-parameters of the standards is essentially the same as measuring 110 S-parameters of the calibration standards described above with respect to method 100 of determining a parameter value.

The method 200 of compensating a calibration further comprises measuring 220 raw S-parameters for an asymmetric reciprocal device using the VNA. Measuring 220 the raw S-parameters of the asymmetric reciprocal device is essentially the same as measuring 120 the raw S-parameters described above with respect to the method 100 of determining a parameter value. Moreover, the asymmetric reciprocal device used in the method 200 of compensating a calibration is essentially the same as the asymmetric reciprocal device described hereinabove with respect to the method 100 of determining a parameter value.

The method 200 of compensating a calibration further comprises adjusting 230 the parameter value of the defining parameter of the calibration standard. Adjusting 230 is essentially the same as adjusting 130 described hereinabove with respect to the method 100 of determining a parameter value. In particular, the parameter value is adjusted 230 to minimize a difference between a corrected forward transmission S-parameter $S_{21}$ and a corrected reverse transmission S-parameter $S_{12}$ for the asymmetric reciprocal device. Thus, according to the method 200 and as described hereinabove with respect to the method 100, the corrected forward and reverse transmission S-parameters are the measured forward and reverse transmission S-parameters for the asymmetric reciprocal device corrected using an error model-based error correction of the VNA. The error model employs the parameter value of the calibration standard parameter being adjusted along with the measured 210 S-parameters of the set of calibration standards to generate a set of error coefficients.

The method 200 of compensating further comprises storing 240 an optimized set of error coefficients for the error model. As mentioned above, the set of error coefficients are optimized error coefficients produced from an optimized set of parameter values that result from adjusting 230. After storing 240, the optimized error coefficients may be used to produce calibrated measurements of a DUT using the VNA and further using conventional error correction.

With respect to the example of the method 100 of determining a parameter value described herein above, an example of applying the method 200 of compensating a calibration would be essentially the same except that instead of optionally reporting 140 the optimized parameter values, a set of optimized error coefficients are stored 240. The stored 240 optimized error coefficients are those computed from the current set of parameter values when the goal is achieved, as described above for the method 100 of determining.

Figure 6:
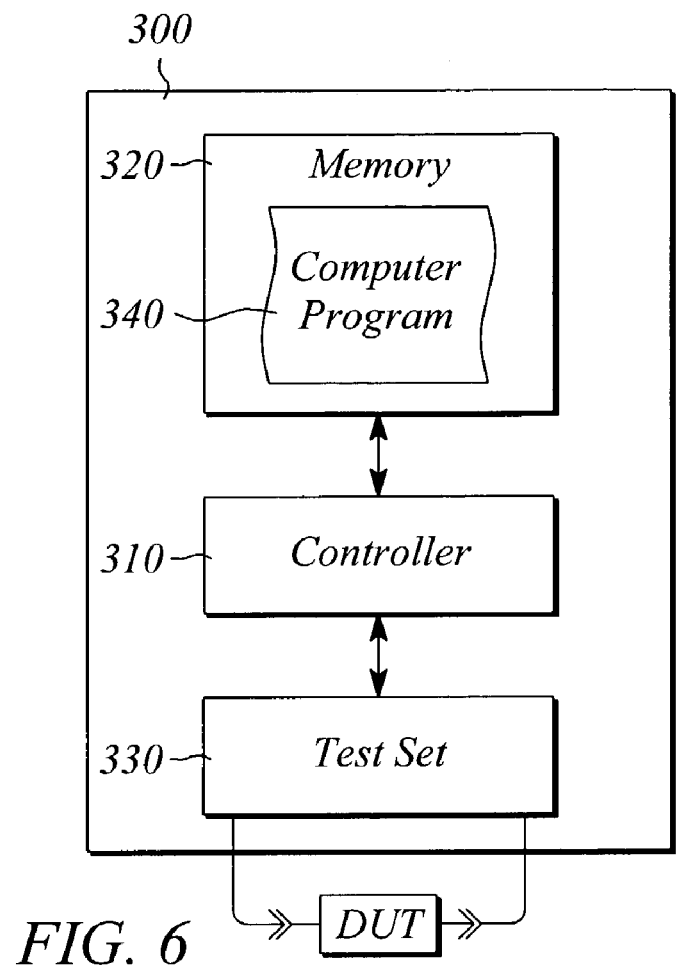
FIG. 6 illustrates a block diagram of a vector network analyzer (VNA) that compensates for inaccuracies in knowledge of calibration standard parameter values used for calibration of the VNA according to an embodiment of the present invention.

FIG. 6 illustrates a block diagram of a vector network analyzer (VNA) 300 according to an embodiment of the present invention. The VNA 300 compensates for inaccuracies in knowledge of a parameter value of a defining parameter for a calibration standard in a set of standards used for calibration of the VNA 300. The inaccuracies are accounted for and the calibration compensated by employing measurements of an asymmetric reciprocal device. As such, the VNA 300 may be calibrated using a set of calibration standards, a parameter value of which is either unknown or poorly known or to be verified. Moreover, the VNA 300 thus compensated may provide calibrated measurements of a device under test (DUT) without the use of a set of precision calibration standards. Additionally, the calibrated measurements may achieve an accuracy level that is consistent with a conventional calibration using precision calibration standards.

The VNA 300 comprises a controller 310, a memory 320, a test set 330, and a computer program 340 stored in the memory 320. The controller 310 controls an operation of the test set 330 by executing instructions of the computer program 340. The controller 310 and the memory 320 may be a conventional microprocessor-based controller used in conventional VNAs, for example.

The test set 330 has ports that are used to connect to the standards of the set of calibration standards. In addition, the ports are used to either connect to an asymmetric reciprocal device or to a DUT. The test set 330, under direction from the controller 310, measures S-parameters of devices and/or calibration standards connected thereto. The test set 330 may be a conventional, 2-port, S-parameter test set, for example.

The computer program 340 comprises instructions that, when executed by the controller 310, facilitate operation of the VNA 300. In particular, the computer program 340 comprises instructions that implement measuring S-parameters for the standards in the set of calibration standards. The computer program 340 further comprises instructions that implement measuring raw S-parameters for an asymmetric reciprocal device. The computer program 340 further comprises instructions that implement adjusting a parameter value of a defining parameter of one or more calibration standards in the set of calibration standards. In particular, the instructions that implement adjusting the defining parameter value perform an iterative adjustment of the parameter value, when desired, until a set of optimized parameter values is determined. The set of optimized parameter values is determined when a metric that assesses a difference between corrected measured forward and reverse transmission S-parameters (e.g., $S_{21}$ and $S_{12}$ for a two-port device) of the asymmetric reciprocal device is minimized with respect to a minimization goal. When the minimization goal is achieved, a set of optimized error coefficients is obtained for the VNA 300 that compensate for test system errors.

In a preferred embodiment, the computer program 340 implements the method 200 of compensating a calibration described hereinabove. In other embodiments, the computer program 340 may further comprise instructions that report the optimized parameter values for the set of calibration standards. Using the reported optimized parameter values, the set of calibration standards may be used to calibrate the VNA 300, or any other VNA for that matter, as if the set were precision calibration standards having known parameter values.

Figure 7:
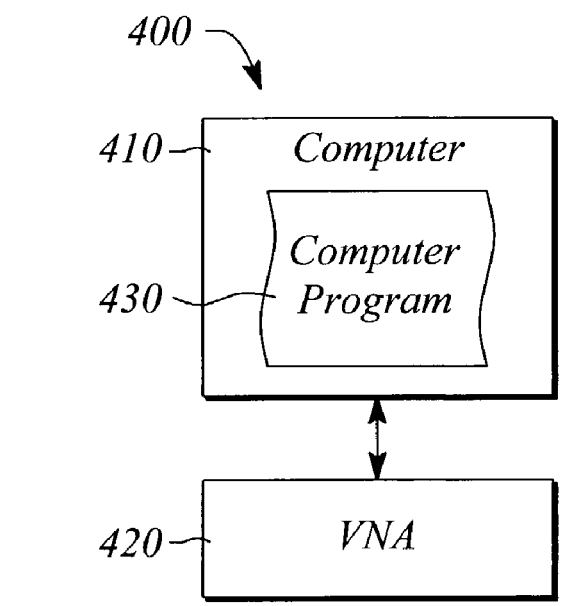
FIG. 7 illustrates a block diagram of a calibration compensation system according to an embodiment of the present invention.

FIG. 7 illustrates a block diagram of a calibration compensation system 400 according to an embodiment of the present invention. In particular, the calibration compensation system 400 determines a parameter value of a defining parameter of a calibration standard in a set of calibration standards using measurements of an asymmetric reciprocal device. The determined parameter value is employed to compensate a measurement of the DUT.

The calibration system 400 comprises a computer or controller 410, a vector network analyzer 420, and a computer program 430 stored in a memory of and executed by the computer 410. The computer program 430 comprises instructions that, when executed by the computer 410, control the VNA 420 to determine parameter values for a set of calibration standards. A calibration standard of the set may have one or more unknown or poorly known defining parameter values.

In particular, the computer program 430 comprises instructions that implement measuring S-parameters of the set of calibrations standards using the VNA 420. The computer program 430 further comprises instructions that implement measuring raw S-parameters for an asymmetric reciprocal device using the VNA 420. The computer program 430 further comprises instructions that implement adjusting the parameter values of the defining parameters of the calibration standard set. Specifically, the instructions that implement adjusting the parameter values perform an iterative adjustment of the parameter values until a set of optimized parameter values is determined. The set of optimized parameter values is determined when a metric that assesses a difference between corrected measured forward and reverse transmission S-parameters, $S_{21}$ and $S_{12}$, of the asymmetric reciprocal device is minimized with respect to a minimization goal. The computer program 430 further comprises instructions that report the set of optimized parameter values.

In a preferred embodiment, the computer program 430 implements the method 100 of determining a parameter value described hereinabove. By employing the optimized parameter values, the set of calibration standards may be used to calibrate the VNA 420. Moreover, the optimized parameter values may be used along with the set of calibration standards to calibrate other VNAs in addition to or instead of the VNA 420. The optimized parameters essentially enable the set of calibration standards to be treated as a set of precision calibration standards. In other embodiments, the computer program 430 further comprises instructions that implement computing and storing error coefficients of an error model of the VNA 420. In still other embodiments, the computer program 430 implements the method 200 of compensating a calibration described above. In yet other embodiments, the VNA 420 is the VNA 300 described above.

Thus, there has been described various embodiments of the present invention that facilitate the use of calibration standards having poorly known defining parameters by employing an asymmetric reciprocal device. A method of determining a parameter value of a calibration standard in a set of standards and a method of compensated calibration of a VNA have been described. In addition, a VNA having compensated calibration and a calibration compensation system have been described. It should be understood that the above-described embodiments are merely illustrative of some of the many specific embodiments that represent the principles of the present invention. Those skilled in the art can readily devise numerous other arrangements without departing from the scope of the present invention.

What is claimed is:

1. A method of determining a parameter value for a set of calibration standards used to calibrate a vector network analyzer comprising:

employing measurements of an asymmetric reciprocal device to optimize a parameter value of a defining parameter of the set of calibration standards, wherein the optimized parameter value minimizes a difference between a corrected forward transmission S-parameter and a corrected reverse transmission S-parameter, the difference being computed from the employed measurements of the asymmetric reciprocal device.

2. The method of determining of claim 1, wherein the corrected forward and reverse transmission S-parameters are computed comprising using the parameter value being optimized; using measurements of the set of calibrations standards; and using an error model of the vector network analyzer.

3. A method of determining a parameter value for a set of calibration standards used to calibrate a vector network analyzer comprising:
employing measurements of an asymmetric reciprocal device to optimize a parameter value of a defining parameter of the set of calibration standards, wherein employing comprises:
measuring S-parameters of the set of calibration standards;
measuring raw S-parameters of the asymmetric reciprocal device; and
adjusting the parameter value to minimize a difference between a corrected forward transmission S-parameter and a corrected reverse transmission S-parameter of the asymmetric reciprocal device.

4. The method of determining of claim 3, wherein the corrected forward and reverse transmission S-parameters are computed from the measured raw S-parameters of the asymmetric reciprocal device using an error correction, coefficients of the error correction being computed from the measured S-parameters of the set of calibration standards and the parameter value being adjusted, and wherein the optimized parameter value is the adjusted parameter value when the difference is minimized.

5. The method of determining of claim 3, wherein parameter values for a plurality of defining parameters are optimized and the S-parameters are measured at a plurality of frequencies.

6. A method of determining a parameter value that describes a calibration standard in a set of calibration standards used to calibrate a vector network analyzer comprising:
measuring S-parameters of the set of calibration standards using the vector network analyzer;
measuring raw S-parameters for an asymmetric reciprocal device using the vector network analyzer; and
adjusting the parameter value that describes the calibration standard until a difference between a corrected forward transmission S-parameter and a corrected reverse transmission S-parameter for the asymmetric reciprocal device is minimized.

7. The method of determining of claim 6, wherein the measured S-parameters of the set of calibration standards along with the parameter value are employed to compute error coefficients of an error model for the vector network analyzer, the computed error coefficients being employed to compute the corrected forward transmission S-parameter and the corrected reverse transmission S-parameter from the measured raw S-parameters.

8. The method of determining of claim 6, wherein adjusting the parameter value comprises iteratively adjusting to minimize the difference.

9. The method of determining of claim 6, wherein adjusting the parameter value comprises:

selecting a value for the parameter value being adjusted;
computing a set of error coefficients of an error model of the vector network analyzer from the measured S-parameters of the set of calibration standards and using the selected value;
applying an error correction to a raw forward transmission S-parameter and a raw reverse transmission S-parameter measured for the asymmetric reciprocal device to produce the corrected forward transmission S-parameter and the corrected reverse transmission S-parameter; and
determining the difference between the corrected forward transmission S-parameter and the corrected reverse transmission S-parameter.

10. The method of determining of claim 9, wherein determining the difference comprises computing a metric given by equation (1)

$$M = \sum_f |S_{21} - S_{12}|^2 \quad (1)$$

where M is the metric, $S_{12}$ is the reverse transmission S-parameter value, $S_{21}$ is the forward transmission S-parameter value, and f is a frequency value.

11. The method of determining of claim 6, further comprising:
reporting a set of optimized parameter values for the set of calibration standards, the optimized set including the adjusted parameter value.

12. The method of determining of claim 6, further comprising:
storing a set of error coefficients of an error model for the vector network analyzer, the set of error coefficients being computed from the measured S-parameters of the set of calibration standards and the adjusted parameter value.

13. The method of determining of claim 6, further comprising:
performing calibrated measurements on a device under test with the vector network analyzer using the set of calibration standards and the adjusted parameter value.

14. A method of compensating a calibration of a vector network analyzer comprising:
optimizing error coefficients of an error model of the vector network analyzer using measurements of an asymmetric reciprocal device,
wherein the calibration is compensated to minimize effects of a poorly known defining parameter of a set of calibration standards used for the calibration, wherein optimizing comprises:
measuring S-parameters of the set of calibration standards using the vector network analyzer;
measuring raw S-parameters for the asymmetric reciprocal device using the vector network analyzer;
adjusting a parameter value of the defining parameter to minimize a difference between a corrected forward transmission S-parameter and a corrected reverse transmission S-parameter for the asymmetric reciprocal device; and
storing a set of the error coefficients for the error model, the error coefficient set being extracted from an optimized set of parameter values, the optimized set including the adjusted parameter value of the defining parameter.

15. The method of compensating of claim 14, wherein adjusting a parameter value comprises iteratively adjusting the parameter value until a minimization goal for the difference is achieved.

16. The method of compensating of claim 14, wherein adjusting a parameter value comprises:
selecting a value of the parameter value being adjusted;
computing a set of error coefficients of the error model of the vector network analyzer from the measured S-parameters of the set of calibration standards and the selected value;
applying an error correction to a raw forward transmission S-parameter and a raw reverse transmission S-parameter measured for the asymmetric reciprocal device to produce the corrected forward transmission S-parameter and the corrected reverse transmission S-parameter; and
determining the difference between the corrected forward transmission S-parameter and the corrected reverse transmission S-parameter.

17. The method of compensating of claim 14, further comprising:
performing calibrated measurements on a device under test with the vector network analyzer using the optimized error coefficients.

18. A method of compensating a calibration of a vector network analyzer comprising:
measuring S-parameters of a set of calibration standards using the vector network analyzer;
measuring raw S-parameters for an asymmetric reciprocal device using the vector network analyzer; and
adjusting a parameter value of the set of calibration standards to minimize a difference between a corrected forward transmission S-parameter and a corrected reverse transmission S-parameter for the asymmetric reciprocal device.

19. The method of compensating of claim 18, further comprising:
storing a set of error coefficients for an error model, the error coefficient set being extracted from an optimized set of parameter values, the optimized set including the adjusted parameter value of the set of calibration standards.

20. The method of compensating of claim 19, wherein adjusting a parameter value comprises:
selecting a value of the parameter value being adjusted;
computing the set of error coefficients for the error model of the vector network analyzer from the measured S-parameters of the set of calibration standards and the selected value;
applying an error correction to a raw forward transmission S-parameter and a raw reverse transmission S-parameter measured for the asymmetric reciprocal device to produce the corrected forward transmission S-parameter and the corrected reverse transmission S-parameter; and
determining the difference between the corrected forward transmission S-parameter and the corrected reverse transmission S-parameter.

21. The method of compensating of claim 18, further comprising:
reporting a set of optimized parameter values for the set of calibration standards the optimized set including the adjusted parameter value.

22. The method of compensating of claim 18, wherein the S-parameters are measured at a plurality of frequencies.

23. A vector network analyzer that compensates for inaccuracies in knowledge of a parameter value of a set of calibration standards comprising:
a test set, the test set comprising a port, the port being temporarily connected to a calibration standard of the set of calibration standards and independently temporarily connected to an asymmetric reciprocal device;
a memory;
a computer program stored in the memory; and
a controller that controls an operation of the test set and executes the computer program,
wherein the computer program comprises instructions that, when executed by the controller, compensate a calibration of the vector network analyzer using measurements of the asymmetric reciprocal device taken with the test set to determine an optimized set of error coefficients, and
wherein the instructions of the computer program comprise instructions that implement measuring S-parameters of the set of calibration standards; instructions that implement measuring raw S-parameters for the asymmetric reciprocal device; instructions that implement adjusting the parameter value of the set of calibration standards to minimize a difference between a corrected forward transmission S-parameter and a corrected reverse transmission S-parameter for the asymmetric reciprocal device, the adjusted parameter value being used to compute the optimized set of error coefficients; and instructions that implement storing the optimized set of error coefficients.

24. A calibration compensation system comprising:
a computer;
a vector network analyzer; and
a computer program stored in a memory, the computer program being executed by the computer,
wherein the computer program comprises instructions that, when executed by the computer, control the vector network analyzer to determine a parameter value of a defining parameter of a calibration standard in a set of calibration standards using a measurement of an asymmetric reciprocal device, and
wherein the instructions of the computer program comprise instructions that implement measuring S-parameters for the set of calibration standards using the vector network analyzer; instructions that implement measuring raw S-parameters for the asymmetric reciprocal device using the vector network analyzer; instructions that implement adjusting the parameter value to minimize a difference between a corrected measured forward transmission S-parameter and a corrected reverse transmission S-parameter of the asymmetric reciprocal device; and instructions that implement reporting an optimized parameter value, the optimized parameter value being the adjusted parameter value for the calibration standard.

25. The calibration compensation system of claim 24, wherein the instructions of the computer program further comprises instructions that implement computing and storing an error coefficient for an error model used by the vector network analyzer, the error coefficient being computed from the optimized parameter value for the defining parameter of the calibration standard.

* * * * *

UNITED STATES PATENT AND TRADEMARK OFFICE
CERTIFICATE OF CORRECTION

PATENT NO. : 7,064,555 B2
APPLICATION NO. : 10/368179
DATED : June 20, 2006
INVENTOR(S) : Jamneala et al.

It is certified that error appears in the above-identified patent and that said Letters Patent is hereby corrected as shown below:

In column 18, line 26, in Claim 10, delete "f" and insert -- $f$ --, therefor.

In column 19, line 63, in Claim 21, after "standards" insert -- , --.

Signed and Sealed this

Nineteenth Day of December, 2006

JON W. DUDAS
*Director of the United States Patent and Trademark Office*